(12) United States Patent
Yan et al.

(10) Patent No.: US 11,884,587 B2
(45) Date of Patent: Jan. 30, 2024

(54) SILICON-LITHIUM-LEAD SYSTEM, CONDUCTIVE PASTE AND PREPARATION METHOD THEREOF

(71) Applicant: Jiangsu Riyu Photovoltaic New Material Technology Co. Ltd, Wuxi (CN)

(72) Inventors: Li Yan, Wuxi (CN); Rui Tian, Wuxi (CN); Song Xu, Wuxi (CN)

(73) Assignee: JIANGSU RIYU PHOTOVOLTAIC NEW MATERIAL TECHNOLOGY CO. LTD, Wuxi (CN)

( * ) Notice: Subject to any disclaimer, the term of this patent is extended or adjusted under 35 U.S.C. 154(b) by 43 days.

(21) Appl. No.: 17/585,697

(22) Filed: Jan. 27, 2022

(65) Prior Publication Data

US 2022/0144689 A1    May 12, 2022

(30) Foreign Application Priority Data

Jan. 6, 2022    (CN) ......................... 202210010565.2

(51) Int. Cl.
*C03C 8/10* (2006.01)
*H01L 31/02* (2006.01)
*C03C 4/14* (2006.01)
*H01L 31/0224* (2006.01)

(52) U.S. Cl.
CPC .................. *C03C 8/10* (2013.01); *C03C 4/14* (2013.01); *H01L 31/022425* (2013.01)

(58) Field of Classification Search
CPC .. C03C 8/10; C03C 8/18; C03C 3/072; H01L 31/022425; H01B 1/16; H01B 1/22; Y02E 10/50
See application file for complete search history.

(56) References Cited

U.S. PATENT DOCUMENTS

| | | | |
|---|---|---|---|
| 2014/0225045 A1* | 8/2014 | Yoshino | C03C 8/10 252/514 |
| 2020/0331796 A1* | 10/2020 | Kim | H01L 31/022425 |

* cited by examiner

*Primary Examiner* — Haidung D Nguyen
(74) *Attorney, Agent, or Firm* — IPRO, PLLC; Na Xu

(57) ABSTRACT

The present disclosure discloses a silicon-lithium-lead system, a conductive paste and a preparation method thereof, and belongs to the field of solar cells. A silicon-lead-lithium oxide frit includes the following composition: $Si_a$—$Pb_b$—$Li_c$—$(B_x$—$Al_y$—$Bi_z)$-$M_e$-$O_f$, where, $0<a<0.6$, $0<b<0.8$, $0<c<0.6$, $x+y+z=d$, the x and the y are not zero at the same time, and the z is greater than zero. In the present disclosure, by adding $B_2O_3$ and $Bi_2O_3$, $Al_2O_3$ and $Bi_2O_3$, or $B_2O_3$, $Al_2O_3$ and $Bi_2O_3$ at the same time, the prepared frit has greater water resistance, and therefore, a solar cell prepared by using the conductive paste containing glass has good water resistance. In addition, the photoelectric conversion efficiency of the solar cell prepared by using the conductive paste prepared in the present disclosure can also be maintained, or even be slightly improved.

10 Claims, 1 Drawing Sheet

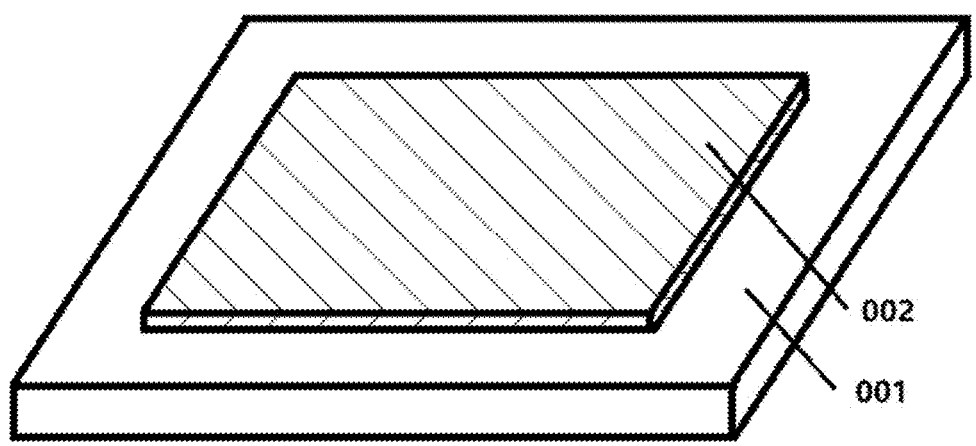

SILICON-LITHIUM-LEAD SYSTEM, CONDUCTIVE PASTE AND PREPARATION METHOD THEREOF

TECHNICAL FIELD

The present disclosure relates to a conductive paste for printing a surface of photovoltaic solar cell equipment having one or more passivation layers, particularly relates to a silicon-lithium-lead system and a conductive paste and preparation method thereof, the conductive paste including a conductive metal, an organic vehicle, and a silicon-lead-lithium oxide.

BACKGROUND

The substrate of a conventional P-type (or N-type) solar cell is of a P-type (or N-type) structure. When sunlight irradiates the P-type or N-type cell, the P-type cell includes an anode on the front and a cathode on the back, and the N-type cell includes an anode on the back and a cathode on the front. When photons are incident on a p-n junction of a semiconductor, electron-hole pair carriers are excited to be generated. These electron-hole pair carriers migrate under an electric field generated by the p-n junction and are collected by an electrode network on a surface of the cell to flow to an external circuit.

As most solar cells have one or more passivation layers on a surface of a silicon wafer, a conductive paste is coated on the passivation layer on the surface of the silicon wafer by screen printing. The conductive paste penetrates through the passivation layer after being fired to form a conductive electrode on the surface of the solar cell, and this electrode is a mixture of a metal and an oxide. By using the oxide in the mixture, the adhesion and the conductivity between the conductive electrode and the silicon wafer are improved. After the silicon wafer is metalized, a solar cell slice is formed. A plurality of solar cells are arranged in a certain order, welded to a metal conduction band and then packaged between a back plate and a tempered glass to form a solar cell module.

During long-term daily use of the solar cell module, the solar cells will be exposed to air and water vapor due to poor sealing of the cell module and various other environmental factors. The water vapor has a corrosion effect on the oxide in the conductive electrode mixture on the surface of the solar cell. When the oxide is corroded by the water vapor, the bonding force and the conductivity between the conductive electrode of the cell and the silicon wafer are reduced, resulting in reduction, or even complete failure of photoelectric conversion efficiency of the solar cell.

The oxide frit in the conductive paste usually includes silicon oxides and alkali metal oxides. A network structure is formed by the silicon oxide to make the oxide frit stable. As an ion in the oxide, an alkali metal $A^+$ is outside the network structure and is easily replaced with $H^+$ in the water vapor to undergo the following reaction: $\equiv Si\text{---}O\text{---}A + H_2O \rightarrow \equiv Si\text{---}O\text{---}H + AOH$. Orthosilicic acid $Si(OH)_4$ is further formed by the $\equiv Si\text{---}O\text{---}H$ under the action of $H_2O$ and AOH and then separated from the network structure of the oxide, resulting in changes of the network structure of the conductive paste. In addition, the alkali metal oxide is gradually corroded under the action of the water vapor. At last, reduction, or even failure of the photoelectric conversion efficiency of the solar cell is caused.

SUMMARY

Technical Problems

As silicon oxides and alkali metal oxides in existing conductive pastes are easily corroded by water vapor in the air, the bonding force and the conductivity between a conductive electrode of a cell and a silicon wafer are reduced, resulting in reduction, or even complete failure of photoelectric conversion efficiency of the solar cell.

Technical Solutions

In order to solve the technical problems above, the present disclosure provides a silicon-lead-lithium system frit. The frit includes the following component:

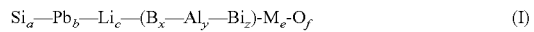

where, $0<a<0.6$, $0<b<0.8$, $0<c<0.6$, $x+y+z=d$, at least one of x, y and z is greater than zero, $0<d<0.6$, $c:d=(5:95)\text{-}(95:5)$, M is one or a mixture of more of Na, K, Mg, Ca, Sr, Ti, Zr, V, Cr, Mo, W, Mn, Cu, Ag, Zn, Cd, Ga, TI, Ge, P and Te, and $a+b+c+d+e=1$.

In an embodiment of the present disclosure, the x and the y are not zero at the same time, and the z is greater than zero.

In an embodiment of the present disclosure, all the x, the y and the z are greater than zero.

In an embodiment of the present disclosure, preferably, $0<a<0.4$, $0<b<0.5$, $0<c<0.4$, $0<d<0.4$, and $c:d=(30:70)\text{-}(90:10)$.

In an embodiment of the present disclosure, preferably, $0<a<0.3$, $0<b<0.4$, $0<c<0.3$, $0<d<0.3$, and $c:d=(40:60)\text{-}(90:10)$.

In an embodiment of the present disclosure, the frit preferably includes the following components based on oxides in mol %: 5-15% of $SiO_2$, 19-25% of PbO, 18-25% of $Li_2O$, 0-2% of $B_2O_3$, 0-2% of $Al_2O_3$, 4-8% of $Bi_2O_3$ and the balance of $MO_x$, and contents of $B_2O_3$ and $Al_2O_3$ are not 0 at the same time.

In an embodiment of the present disclosure, the frit preferably includes the following components based on oxides in mol %: 8%-15% of $SiO_2$, 19%-22% of PbO, 20%-25% of $Li_2O$, 1%-2% of $B_2O_3$, 1-2% of $Al_2O_3$, 4%-7% of $Bi_2O_3$ and the balance of $MO_x$.

In an embodiment of the present disclosure, the frit optimally includes the following components based on oxides in mol %: 15% of $SiO_2$, 20% of PbO, 20% of $Li_2O$, 2% of $B_2O_3$, 2% of $Al_2O_3$, 6% of $Bi_2O_3$ and 35% of $MO_x$.

The present disclosure further provides a conductive paste including the silicon-lead-lithium oxide frit above. The conductive paste includes, by weight percentage, 84%-94% of a conductive metal, 0.1-9% of silicon-lead-lithium system frit above and 5%-15% of an organic vehicle.

In an embodiment of the present disclosure, the conductive metal is one or more of silver, gold, platinum, rhodium, copper, nickel and aluminum.

In an embodiment of the present disclosure, the conductive metal is preferably silver.

In an embodiment of the present disclosure, the organic vehicle includes an organic binder, an organic solvent, a thixotropic agent and a surfactant.

In an embodiment of the present disclosure, the organic binder is one or more of ethyl cellulose, polyacrylic acid, phenolic resin, polyvinyl butyral, polyethylene resin, polyurethane resin, polyester resin, polycarbonate, a rosin derivative and a combination thereof.

In an embodiment of the present disclosure, the organic solvent is one or more of carbitol, terpineol, hexyl carbitol, butyl carbitol acetate, dimethyl adipate glycol ether and butyl carbitol.

In an embodiment of the present disclosure, the thixotropic agent is one or more of a castor oil derivative, polyamide, a polyamide derivative, fumed silica, a carboxylic acid derivative and a fatty acid derivative.

In an embodiment of the present disclosure, the surfactant is one or more of polyethylene oxide, benzotriazole, polyethylene glycol, organic silicone oil, poly(ethylene glycol) acetic acid, linoleic acid, stearic acid, lauric acid, oleic acid, capric acid, myristic acid, palmitic acid, stearate and palmitate.

In an embodiment of the present disclosure, the silicon-lead-lithium system frit is 0.5-5% of the conductive paste in weight.

The present disclosure further provides a preparation method of the conductive paste. The method includes: weighing the conductive metal, the silicon-lead-lithium system frit and the organic vehicle above according to a proportion of a formula, uniformly mixing and stirring the raw materials of the conductive paste by using a mixing stirrer, repeatedly milling the conductive paste by using a three-roll mill, and further mixing the conductive paste uniformly by using a shearing force between rollers of the three-roll mill.

The present disclosure further provides a solar cell device. The device includes the water-resistant silicon-lead-lithium system frit or the conductive paste above.

The present disclosure further provides application of the silicon-lead-lithium system frit with low heat loss or the conductive paste above in the field of utilization of solar energy.

Compared with the prior art, the present disclosure has the following advantages and effects.

In the present disclosure, by adding $B_2O_3$ and $Bi_2O_3$, $Al_2O_3$ and $Bi_2O_3$, or $B_2O_3$, $Al_2O_3$ and $Bi_2O_3$ at the same time, the prepared silicon-lead-lithium frit has great water resistance, and therefore, a solar cell prepared by using the conductive paste containing glass has better water resistance. In addition, the photoelectric conversion efficiency of the solar cell prepared by using the conductive paste prepared in the present disclosure can also be maintained, or even be slightly improved. According to the present disclosure, the problems can be effectively solved that due to corrosion by the water vapor, the bonding force and the conductivity between the conductive electrode of the cell and the silicon wafer are reduced, resulting in reduction, or even complete failure of the photoelectric conversion efficiency of the solar cell.

BRIEF DESCRIPTION OF FIGURES

FIG. 1 shows that an inorganic oxide is printed on an $Al_2O_3$ substrate and then sintered to form a smooth and uniform film. 001 refers to the $Al_2O_3$ substrate, and 002 refers to an oxide film.

DETAILED DESCRIPTION

The present disclosure is further described below in conjunction with examples, but embodiments of the present disclosure are not limited thereto.

In order to reduce the corrosion of an oxide in a conductive electrode mixture by water vapor, a silicon-lead-lithium oxide of the present disclosure includes the following component:

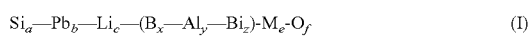  (I)

where, $0<a<0.6$, $0<b<0.8$, $0<c<0.6$, $x+y+z=d$, at least one of x, y and z is greater than zero, $0<d<0.6$, $c:d=(5:95)-(95:5)$, M is one or a mixture of more of Na, K, Mg, Ca, Sr, Ti, Zr, V, Cr, Mo, W, Mn, Cu, Ag, Zn, Cd, Ga, TI, Ge, P and Te, and $a+b+c+d+e=1$.

Preferably, the x and the y are not zero at the same time, and the z is greater than zero. More preferably, the x and the y are not zero at the same time, and the z is greater than zero.

Firstly, when the radius of an alkali metal ion is increased, the bond strength of an alkali metal oxide is lowered, and the chemical stability is reduced. For the water resistance, $Li^+>Na^+>K^+$. Therefore, Li is the first choice among the alkali metal elements.

Secondly, the water corrosion resistance of the alkali metal oxide can be improved by using several trivalent oxides. When boron oxide is used, a glass has a "boron oxide anomaly" phenomenon of chemical stability. When $B_2O_3$ is added, $B^{3+}$ borrows electrons from $Li^+$, and an original $[BO_3]$ triangle is changed into a $[BO_4]$ tetrahedron, and this can reconnect broken bonds, so that a network structure is strengthened, and a water corrosion effect is significantly reduced. When $Al_2O_3$ is added into the alkali metal oxide, the chemical stability can also be greatly improved. This is because $Al^{3+}$ borrows electrons from the $Li^+$ to form a $[AlO_4]$ tetrahedron, and this achieves a supplement effect on a silicon-oxygen network. Similarly, it is found in experiments that when $Bi_2O_3$ is added, a complex network structure of $[BiO_6]$ also achieves a supplement effect on the silicon-oxygen network, and the water corrosion resistance of the alkali metal oxide is improved.

In order to test the water corrosion resistance of the alkali metal oxide, a following test method is used in the present disclosure. An inorganic oxide and an organic vehicle are uniformly mixed according to a certain proportion and then prepared into an oxide paste by using a three-roll mill. Several $Al_2O_3$ substrates are taken out and weighed to obtain a tare weight $W_T$. The oxide paste is printed on the $Al_2O_3$ substrate. Then, the substrate is heated to 600-800° C. in a high-temperature furnace. The organic vehicle is completely volatilized and burned off, and the inorganic oxide is sintered on the $Al_2O_3$ substrate to form a smooth and uniform film. The structure of the substrate is shown in FIG. 1, 001 refers to the $Al_2O_3$ substrate, and 002 refers to an oxide film. A sample is weighed to obtain an initial gross weight $W_0$. The oxide film and the $Al_2O_3$ substrate are soaked in deionized water. A cover is used for sealing to prevent water from completely evaporating. The sample is heated to 75° C. for 24 hours. The sample is taken out, thoroughly washed with deionized water and then heated to 75° C. again for 30 minutes. After a surface of the sample is completely dry, the sample is taken out and weighed again to obtain a gross weight $W_1$.

An oxide corroded by the water can be calculated in weight percentage by using the following formula: $\Delta W\% = (W_1-W_0)/(W_0-W_T) \times 100\%$, and the measurement error is ±0.05‰.

Determination method of photoelectric conversion efficiency: The photoelectric conversion efficiency of a cell is determined by using a HALM IV tester.

Example 1

Mixing was conducted according to proportions of S1-S3 in Table 1 to obtain a mixed composition. The mixed composition was melted at about 900-1,300° C. and then quenched to about 25° C. An obtained material was pulverized by using a planetary mill and then dried to obtain a uniform glass powder. The glass powder and an organic vehicle (a mixture of ethyl cellulose and butyl carbitol acetate in a mass ratio of 1:7) were uniformly mixed in a ratio of 75%:25% and then prepared into a glass paste by using a three-roller mill. Several $Al_2O_3$ substrates were taken out and weighed to obtain a tare weight $W_T$. An oxide paste was printed on the $Al_2O_3$ substrate. Then, the substrate was heated to 800° C. in a high-temperature furnace. The organic vehicle was completely volatilized and burned, and an oxide was sintered on the $Al_2O_3$ substrate to form a smooth and uniform film. The water corrosion resistance was tested by using the method above, and results were shown in Table 1.

0.6% (mass percentage, the same below) of an organic binder (ethyl cellulose and polyvinyl butyral in a mass ratio of 7:3), 0.4% of a thixotropic agent (polyamide), 0.5% of a surfactant (organic silicone oil), 0.3% of a surfactant (tallow diamine dioleate), and 6.4% of an organic solvent (a mixture of butyl carbitol acetate and dimethyl adipate in a mass ratio of 5:5) were stirred under a high shear force at 50-60° C. for 1-2 hours. 2.4% of the glass powder prepared above and 89.4% of a silver powder were added into the mixture above and then stirred thoroughly to form a mixture. The paste composition was repeatedly ground by using a three-roll grinder to obtain a conductive paste. Then, the conductive paste was printed on a silicon wafer substrate by using a screen-printing technology. A cell slice was dried in an infrared drying furnace, sintered by using a belt type firing furnace at 750-850° C. and then cooled to form a cell. The photoelectric conversion efficiency of the cell was determined by using a HALM IV tester. The photoelectric conversion efficiency of the cell was shown in Table 1.

From Table 1, it could be seen that when lithium oxide was changed into sodium oxide or potassium oxide, the weight of an oxide corroded by water in the prepared conductive paste was significantly increased, and the photoelectric conversion efficiency of the conductive paste was also significantly reduced. This was because when the radius of an alkali metal ion was increased, the bond strength was lowered, and the chemical stability was reduced. Therefore, for the water resistance, $Li^+ > Na^+ > K^+$. Therefore, when an alkali metal oxide was selected in the present disclosure, the $Li^+$ was preferably selected to improve the water corrosion resistance of the conductive paste.

TABLE 1

Formulae of S1 to S3 (in mol %) and performance test data thereof

| Sample | S1 | S2 | S3 |
|---|---|---|---|
| $SiO_2$ | 15% | 15% | 15% |
| PbO | 20% | 20% | 20% |
| $Li_2O$ | 20% | — | — |
| $Na_2O$ | — | 20% | — |
| $K_2O$ | — | — | 20% |
| $B_2O_3$ | — | — | — |
| $Al_2O_3$ | — | — | — |
| $Bi_2O_3$ | — | — | — |
| MgO | — | — | — |
| CaO | — | — | — |
| ZnO | — | — | — |
| $Cr_2O_3$ | — | — | — |
| $MoO_3$ | 1% | 1% | 1% |
| $WO_3$ | 4% | 4% | 4% |
| $Ag_2O$ | 2% | 2% | 2% |
| $TeO_2$ | 38% | 38% | 38% |
| Total | 100.0% | 100.0% | 100.0% |
| ΔW | 1.7‰ | 2.3‰ | 2.6‰ |
| Eta (%) | 22.83% | 21.63% | 20.55% |

Example 2

A glass paste and a conductive paste were separately prepared according to formulae in Table 2. Samples S4-S10 were prepared by using the same preparation method in Example 1. The water resistance and the photoelectric conversion efficiency were determined, and results were shown in Table 2.

From Table 2, it could be seen that when $B_2O_3$, $Al_2O_3$, or $Bi_2O_3$ was added into the sample S1, compared with the sample S1, the water resistance of the samples S4-S6 was improved to a certain extent, the mass loss of the samples after water corrosion was decreased by 0.2-0.3‰, and the photoelectric conversion efficiency of the sample S4 and the sample S6 was not significantly changed in comparison with S1. However, when $Al_2O_3$ was added, the photoelectric conversion efficiency of the sample S5 was reduced to a certain extent. When MgO, CaO, ZnO, or $Cr_2O_3$ was added into the sample S1, the water resistance of the samples S7-S10 was not significantly increased, or even reduced, indicating that MgO, CaO, ZnO, or $Cr_2O_3$ had no obvious effect of improving the water resistance of the conductive paste. Therefore, in order to improve the water resistance of the conductive paste, $B_2O_3$, $Al_2O_3$, or $Bi_2O_3$ was preferably added, and $Al_2O_3$ was not added separately.

TABLE 2

Formulae of S4-S10 (in mol %) and performance test data thereof

| Sample | S1 | S4 | S5 | S6 | S7 | S8 | S9 | S10 |
|---|---|---|---|---|---|---|---|---|
| $SiO_2$ | 15% | 15% | 15% | 15% | 15% | 15% | 15% | 15% |
| PbO | 20% | 20% | 20% | 20% | 20% | 20% | 20% | 20% |
| $Li_2O$ | 20% | 20% | 20% | 20% | 20% | 20% | 20% | 20% |
| $Na_2O$ | — | — | — | — | — | — | — | — |
| $K_2O$ | — | — | — | — | — | — | — | — |
| $B_2O_3$ | — | 2% | — | — | — | — | — | — |
| $Al_2O_3$ | — | — | 2% | — | — | — | — | — |
| $Bi_2O_3$ | — | — | — | 6% | — | — | — | — |
| MgO | — | — | — | — | 3% | — | — | — |
| CaO | — | — | — | — | — | 3% | — | — |
| ZnO | — | — | — | — | — | — | 6% | — |
| $Cr_2O_3$ | — | — | — | — | — | — | — | 2% |
| $MoO_3$ | 1% | 1% | 1% | 1% | 1% | 1% | 1% | 1% |

TABLE 2-continued

Formulae of S4-S10 (in mol %) and performance test data thereof

| Sample | S1 | S4 | S5 | S6 | S7 | S8 | S9 | S10 |
|---|---|---|---|---|---|---|---|---|
| $WO_3$ | 4% | 4% | 4% | 4% | 4% | 4% | 4% | 4% |
| $Ag_2O$ | 2% | 2% | 2% | 2% | 2% | 2% | 2% | 2% |
| $TeO_2$ | 38% | 36% | 36% | 32% | 35% | 35% | 32% | 36% |
| Total | 100.0% | 100.0% | 100.0% | 100.0% | 100.0% | 100.0% | 100.0% | 100.0% |
| ΔW | 1.7‰ | 1.5‰ | 1.4‰ | 1.5‰ | 1.7‰ | 2.0‰ | 1.9‰ | 1.6‰ |
| Eta (%) | 22.83% | 22.82% | 22.78% | 22.84% | 22.81% | 22.80% | 22.84% | 22.83% |

Example 3

A glass paste and a conductive paste were separately prepared according to formulae in Table 3. Samples S11-S18 were prepared by using the same preparation method in Example 1. The water resistance and the photoelectric conversion efficiency were determined, and results were shown in Table 3.

According to the samples S11-S14 in Table 3, it could be seen that although the water resistance of the conductive paste could be effectively improved by separately adding $B_2O_3$, $Al_2O_3$, or $Bi_2O_3$, when $B_2O_3$ and $Al_2O_3$ were added at the same time, the loss of an oxide corroded by water could be significantly decreased, the water resistance was improved, and the conversion efficiency of the obtained conductive paste was significantly reduced. However, when $B_2O_3$ and $Bi_2O_3$, $Al_2O_3$ and $Bi_2O_3$, or $B_2O_3$, $Al_2O_3$ and $Bi_2O_3$ were added at the same time, the loss of an oxide corroded by water was not greater than 1.2‰, and the photoelectric conversion efficiency could also be improved to a certain extent. Therefore, conductive pastes obtained by adding $B_2O_3$ and $Bi_2O_3$, $Al_2O_3$ and $Bi_2O_3$, or $B_2O_3$, $Al_2O_3$ and $Bi_2O_3$ at the same time were preferably selected.

TABLE 3

Formulae of S11 to S18 (in mol %) and performance test data thereof

| Sample | S1 | S11 | S12 | S13 | S14 | S15 | S16 | S17 | S18 |
|---|---|---|---|---|---|---|---|---|---|
| $SiO_2$ | 15% | 15% | 15% | 15% | 15% | 5% | 11% | 8% | 17% |
| PbO | 20% | 20% | 20% | 20% | 20% | 25% | 19% | 22% | 14% |
| $Li_2O$ | 20% | 20% | 20% | 20% | 20% | 18% | 21% | 25% | 12% |
| $Na_2O$ | — | — | — | — | — | — | — | — | — |
| $K_2O$ | — | — | — | — | — | — | — | — | — |
| $B_2O_3$ | — | 2% | 2% | — | 2% | 1% | 2% | 1% | — |
| $Al_2O_3$ | — | 2% | — | 2% | 2% | — | — | 1% | 1% |
| $Bi_2O_3$ | — | — | 6% | 6% | 6% | 8% | 4% | 7% | 8% |
| MgO | — | — | — | — | — | — | — | — | — |
| CaO | — | — | — | — | — | — | — | — | — |
| ZnO | — | — | — | — | — | — | — | — | — |
| $Cr_2O_3$ | — | — | — | — | — | — | — | — | — |
| $MoO_3$ | 1% | 1% | 1% | 1% | 1% | 1% | 1% | 1% | 1% |
| $WO_3$ | 4% | 4% | 4% | 4% | 4% | 4% | 4% | 4% | 4% |
| $Ag_2O$ | 2% | 2% | 2% | 2% | 2% | 1% | 1% | 1% | 1% |
| $TeO_2$ | 38% | 34% | 30% | 30% | 28% | 36% | 35% | 28% | 41% |
| CaO | | | | | | | 1% | | 2% |
| MgO | | | | | | | | 2% | 1% |
| Total | 100.0% | 100.0% | 100.0% | 100.0% | 100.0% | 100.0% | 100.0% | 100.0% | 100.0% |
| ΔW | 1.7‰ | 1.0‰ | 1.1‰ | 0.9‰ | 0.8‰ | 1.2‰ | 1.0‰ | 1.1‰ | 0.9‰ |
| Eta (%) | 22.83% | 22.73% | 22.87% | 22.84% | 22.86% | 22.85% | 22.87% | 22.86% | 22.79% |

When the sample S18 included a too high content of $SiO_2$, a too low content of PbO and a too low content of $Li_2O$, although the water corrosion resistance of the conductive paste could be effectively improved, the photoelectric conversion efficiency was significantly reduced. Therefore, the contents of the three substances needed to be controlled to achieve the effects that the water corrosion resistance was improved, and the photoelectric conversion efficiency was not reduced.

According to a large number of experiments, it is shown that the conductive paste of the present disclosure includes, in mol %, 5-15% of $SiO_2$, 19-25% of PbO, 18-25% of $Li_2O$, 0-2% of $B_2O_3$, 0-2% of $Al_2O_3$, 4-8% of $Bi_2O_3$ and the balance of $MO_x$, contents of $Bi_2O_3$ and $Al_2O_3$ are not 0 at the same time, and M is one or a mixture of more of Na, K, Mg, Ca, Sr, Ti, Zr, V, Cr, Mo, W, Mn, Cu, Ag, Zn, Cd, Ga, Tl, Ge, P and Te. The conductive paste can achieve the effects that the mass loss of a sample after water corrosion is not greater than 1.2‰, and the photoelectric conversion efficiency is not reduced. Preferably, the conductive paste includes 8%-15% of $SiO_2$, 19%-22% of PbO, 20%-25% of $Li_2O$, 1%-2% of $B_2O_3$, 1-2% of $Al_2O_3$, 4%-7% of $Bi_2O_3$ and the balance of $MO_x$. The conductive paste of the present disclosure optimally includes 15% of $SiO_2$, 20% of PbO, 20% of $Li_2O$, 2% of $B_2O_3$, 2% of $Al_2O_3$, 6% of $Bi_2O_3$ and 35% of $MO_x$.

Although preferred examples of the present disclosure are disclosed above, the present disclosure is not limited thereto. Various changes and modifications can be made by anyone familiar with this technology without departing from the spirit and scope of the present disclosure. Therefore, the protection scope of the present disclosure should be defined by the claims.

What is claimed is:

1. A silicon-lead-lithium oxide frit, comprising the following component:

$$Si_a\text{—}Pb_b\text{—}Li_c\text{—}(B_x\text{—}Al_y\text{—}Bi_z)\text{-}M_e\text{-}O_f \quad (I)$$

wherein, $0.05 \leq a \leq 0.15$, $0.19 \leq b \leq 0.25$, $0.21 \leq c \leq 0.25$, $0 \leq x \leq 0.02$, $0 \leq y \leq 0.02$, $0.04 \leq z \leq 0.08$, $x+y+z=d$, at least one of x, y and z is greater than zero, $0<d<0.12$, c:d=(5:95)-(95:5), M is one or a mixture of more of Na, K, Mg, Ca, Sr, Ti, Zr, V, Cr, Mo, W, Mn, Cu, Ag, Zn, Cd, Ga, Tl, Ge, P and Te, and a+b+c+d+e=1; wherein f is an amount O that balances the valence of the silicon-lead-lithium oxide frit;

wherein x and y are not zero at the same time.

2. The silicon-lead-lithium oxide frit according to claim 1, wherein all the x, the y and the z are greater than zero.

3. The silicon-lead-lithium oxide frit according to claim 1, wherein c:d=(30:70)-(90:10).

4. The silicon-lead-lithium oxide frit according to claim 1, wherein c:d=(40:60)-(90:10).

5. A conductive paste of a silicon-lead-lithium oxide frit, comprising, by weight percentage, 84%-94% of a conductive metal, 0.1-9% of the silicon-lead-lithium oxide frit according to claim 1 and 5%-15% of an organic material.

6. The conductive paste of a silicon-lead-lithium oxide frit according to claim 5, wherein the conductive metal is one or more of silver, gold, platinum, rhodium, copper, nickel and aluminum; and the organic material comprises an organic binder, an organic solvent, a thixotropic agent, a surfactant or any combination thereof.

7. The conductive paste of a silicon-lead-lithium oxide frit according to claim 6, wherein the conductive metal is silver.

8. A method of preparing the conductive paste of a silicon-lead-lithium oxide frit according to claim 5, the method comprising: weighing the conductive metal, the silicon-lead-lithium system frit and the organic vehicle according to a proportion of a formula, uniformly mixing and stirring the raw materials of the conductive paste by using a mixer, repeatedly milling the conductive paste by using a three-roll mill, and further mixing the conductive paste uniformly by using a shearing force between rollers of the three-roll mill.

9. A solar cell device, wherein the solar cell device comprises the silicon-lead-lithium oxide frit according to claim 1.

10. A solar cell device, wherein the solar cell device comprises the conductive paste of a silicon-lead-lithium oxide frit according to claim 5.

* * * * *